(12) United States Patent
Samuelson et al.

(10) Patent No.: US 8,143,658 B2
(45) Date of Patent: Mar. 27, 2012

(54) CHARGE STORAGE NANOSTRUCTURE

(75) Inventors: Lars Samuelson, Malmö (SE); Claes Thelander, Lund (SE)

(73) Assignee: QuNano AB, Lund (SE)

( * ) Notice: Subject to any disclaimer, the term of this patent is extended or adjusted under 35 U.S.C. 154(b) by 0 days.

(21) Appl. No.: 12/450,373

(22) PCT Filed: Mar. 26, 2008

(86) PCT No.: PCT/SE2008/050334
§ 371 (c)(1),
(2), (4) Date: Sep. 24, 2010

(87) PCT Pub. No.: WO2008/118084
PCT Pub. Date: Oct. 2, 2008

(65) Prior Publication Data
US 2011/0204331 A1    Aug. 25, 2011

(30) Foreign Application Priority Data

Mar. 27, 2007  (SE) ..................................... 0700792

(51) Int. Cl.
*H01L 27/108* (2006.01)
*H01L 21/8242* (2006.01)
(52) U.S. Cl. .................. 257/300; 257/E27.084; 257/24; 257/192; 977/936; 977/937; 977/938
(58) Field of Classification Search .................. 257/300, 257/E27.084; 977/936, 937, 938
See application file for complete search history.

(56) References Cited

U.S. PATENT DOCUMENTS

| 7,120,072 | B2 * | 10/2006 | Ye et al. ......................... 365/203 |
| 2007/0126079 | A1 * | 6/2007 | Shioya et al. .................. 257/532 |

OTHER PUBLICATIONS

Nilsson et al., "Nanowire-based multiple quantum dot memory." Applied Physics Letters 89, 163101 (2006).
Bryllert et al., "Vertical High-Mobility Wrap-Gated InAs Nanowire Transistor." IEEE Electron Device Letters, vol. 27, No. 5 (May 2006).
Likharev, "Layered tunnel barriers for non-volatile memory devices." Applied Physics Letters 73, No. 15 (1998).
Thelander et al., "Nanowire-based one-dimensional electronics." Materials Today, vol. 9, No. 10 (Oct. 2006).
Stone et al., "Silicon single electron memory cell." Applied Physics Letters 73, No. 15 (1998).

* cited by examiner

*Primary Examiner* — Jerome Jackson, Jr.
*Assistant Examiner* — Paul Budd
(74) *Attorney, Agent, or Firm* — The Marbury Law Group, PLLC

(57) ABSTRACT

The present invention relates to a nanostructured device for charge storage. In particular the invention relates to a charge storage device that can be used for memory applications. According to the invention the device comprise a first nanowire with a first wrap gate arranged around a portion of its length, and a charge storing terminal connected to one end, and a second nanowire with a second wrap gate arranged around a portion of its length. The charge storing terminal is connected to the second wrap gate, whereby a charge stored on the charge storing terminal can affect a current in the second nanowire. The current can be related to written (charged) or unwritten (no charge) state, and hence a memory function is established.

13 Claims, 3 Drawing Sheets

CHARGE STORAGE NANOSTRUCTURE

CROSS-REFERENCE TO RELATED APPLICATIONS

This application is a National Stage application of PCT/SE2008/050334, filed Mar. 26, 2008, which claims priority from Swedish application SE 0700792-5, filed Mar. 27, 2007.

FIELD OF THE INVENTION

The present invention relates to a nanostructured charge storage device adapted for data storage. In particular the invention relates to a charge storage device wherein vertical nanowires are used as active components.

BACKGROUND OF THE INVENTION

The interest in single electron devices, and in particular single electron memories, has over the last couple of years shown a significant increase. The interest for the data storage applications is arising primarily from the seemingly ever increasing demand for faster and more densely packed memories in combination with recent reports indicating that such memories are technologically achievable. Compared to the today most used nonvolative memories for handheld devices, flash memories, memories based on single-electron devices have the potential of offering extremely dense memories since the devices are of nanoscale dimensions. Another advantage is very low power consumption due to the fact that only a very limited number of electrons are involved in the basic operations, which also can give very fast operation. The term "single electron memory" is somewhat misleading in that more than one electron may be used for representing a state (bit), although involving order of magnitudes less electrons than conventional memories. Hereinafter the term "single electron memory" should be interpreted as also comprising devices wherein a plurality, but a comparable small number, of electrons are used to represent a state. Alternatively, which also is encompassed by the term "single electron memories", the absence of electrons, i.e. positive charge, is used for the representation. A small number in this context is below thousands of electrons/charges.

The realization of single electron devices has become possible through the advances in nanotechnology techniques and processes now providing structures that range in size from small devices of atomic dimensions, to much larger structures for example on the microscopic scale. Commonly, such structures include "nanostructures". In certain contexts nanostructures are considered to be those having at least two dimensions not greater than about 100 nm. Nanostructures include one-dimensional nanoelements, essentially in one-dimensional form, that are of nanometer dimensions in their width or diameter, and that are commonly known as nanowhiskers, nanorods, nanowires, nanotubes, etc.

In regard to data storage, there have been proposals, and devices constructed, operating on the principle of storage of a single electron in an array of conductive islands separated by tunnel barriers, referred to as multiple tunnel junction (MJT) memories. The basic principle, to be exploited for the memory functionality, is that charge that is introduced to the structure by applying a voltage, can be confined to one part of the memory structure for an extended time, due to the tunnel barriers giving an energy barrier and thus a metastable state is formed. The presence of the charge, which can be detected by for example a field effect transistor, may represent a state (bit). A comprehensive overview is given in section 3.4 "Single Electron Trap" of Chapter II "Electronics below 10 nm", Likharev pp. 27-68 of "Nano and Giga challenges in nanoelectronics", Greer et al (Elsevier 2003). Implementations of such structures are disclosed in for example: Dutta et al, APL vol. 75, no. 10 6 Sep. 1999, pp. 1422-1424 "Silicon-based single electron memory using a multiple-tunnel junction fabricated by electron-beam direct writing"; Stone et al, APL vol. 73 no. 15, 12 Oct. 1998, pp. 2134-2136 "Silicon single electron memory cell".

U.S. Pat. No. 6,126,654 and Likharev et al, APL 73, 15 12 Oct. 1998 pp. 2137-9 "Layered tunnel barriers for nonvolatile memory devices" disclose a read/write head for scanning a two-dimensional array of nanometer sized particles, small groups of such particles forming individual storage devices.

In U.S. Ser. No. 11/359,410 nanowires or nanowhiskers, are used in a data storage device. The nanowires comprise a sequence of axial segments of materials of different band gaps, arranged to provide a sequence of conductive islands separated by tunnel barriers. A storage island is formed in one end of the conductive island/tunnel barrier sequence, to provide data storage capability.

H. Nilsson et al, Applied Physics Letters 89, 163101, 2006, disclose a nanowire-based multiple quantum dot memory. Charge is injected in a nanowire comprising a multiple tunnel barrier structure formed by a quantum dots. The multiple tunnel barrier structure makes it possible to store the charge. The memory further comprises a field effect transistor read out circuit.

SUMMARY OF THE INVENTION

Obviously the prior art single electron devices can be improved in order to fulfil the anticipated advantages, as regards to reproducibility, scalability, and performance at non cryogenic temperatures. In addition the write and read-out facilities to a memory device could be improved.

The object of the present invention is to provide a nanostructured data storage device that overcomes the drawbacks of the prior art devices. This is achieved by the charge storage device as defined in claim 1.

According to the invention the charge storing device comprise a first nanowire with a first wrap gate arranged around a portion of its length, and a charge storing terminal connected to one end, and a second nanowire with a second wrap gate arranged around a portion of its length. The charge storing terminal is connected to the second wrap gate, whereby a charge stored on the charge storing terminal can affect a current in the second nanowire. The current can be related to written (charged) or unwritten (no charge) state, and hence a memory function is established.

Thanks to the invention it is possible to reproducibly produce nanostructured data storage devices with relatively simple read and write procedures.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION

Figure 1:
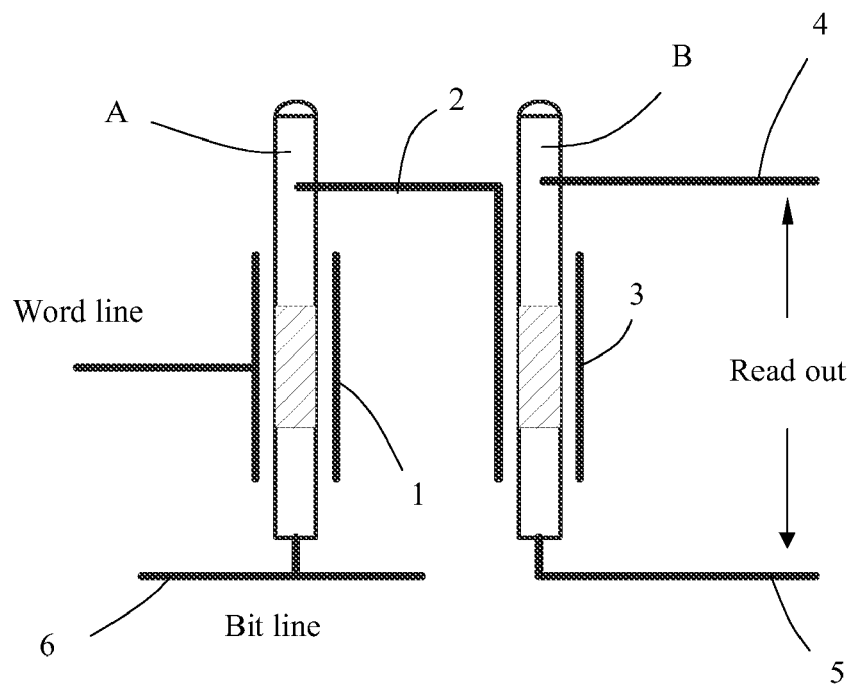
FIG. 1 schematically illustrates a charge storage device according to the invention, FIGS. 2a-d schematically illustrate a charge storage device having individual bottom contacts according to the present invention, FIG. 3 schematically illustrates a charge storage device having common ground connection according to the present invention, and FIG. 4 schematically illustrates a charge storage device having nanowires of different dimensions according to the invention.

FIG. 1 schematically illustrates a charge storage device according to the invention comprising a first nanowire A and a second nanowire B. Each of the nanowires are made of semiconductor material and are at least along a portion of the length thereof surrounded by a dielectric layer 8. The dielectric layer 8 has dielectric properties but is not limited to insulators. Semiconductor materials having a high bandgap in comparison with the surrounded nanowire, i.e. an electron band offset of about 1.0 eV and higher, may be used as well. A first wrap gate 1 is arranged around the first nanowire A and its dielectric layer 8, and a second wrap gate 3 is arranged around the second nanowire B and its dielectric layer 8. A charge storing terminal 2 is connected to one end of the first nanowire A. The charge storing terminal 2 is in connection to the second wrap gate 3, i.e. the wrap gate of the second nanowire B. Due to the charge storage capability the charge storage device is functional as a memory.

In one embodiment of the present invention the first and the second nanowires A, B are vertically arranged on a substrate by epitaxial growth. A vertical design of the charge storage device offers a small footprint, and also axial and radial structural design options for optimized device performance.

Writing of the memory is done by applying a voltage a to wrap-around gate 1 to lower the resistance of a nanowire section 9 within. A charge can then be injected into the charge storing terminal 2 by applying a voltage β to a bit line contact 6 connected to the base of nanowire A (bit line). Reading of the memory is done using a source contact 5 and a drain contact 4 connected to each end of the second nanowire B.

Figure 2A:
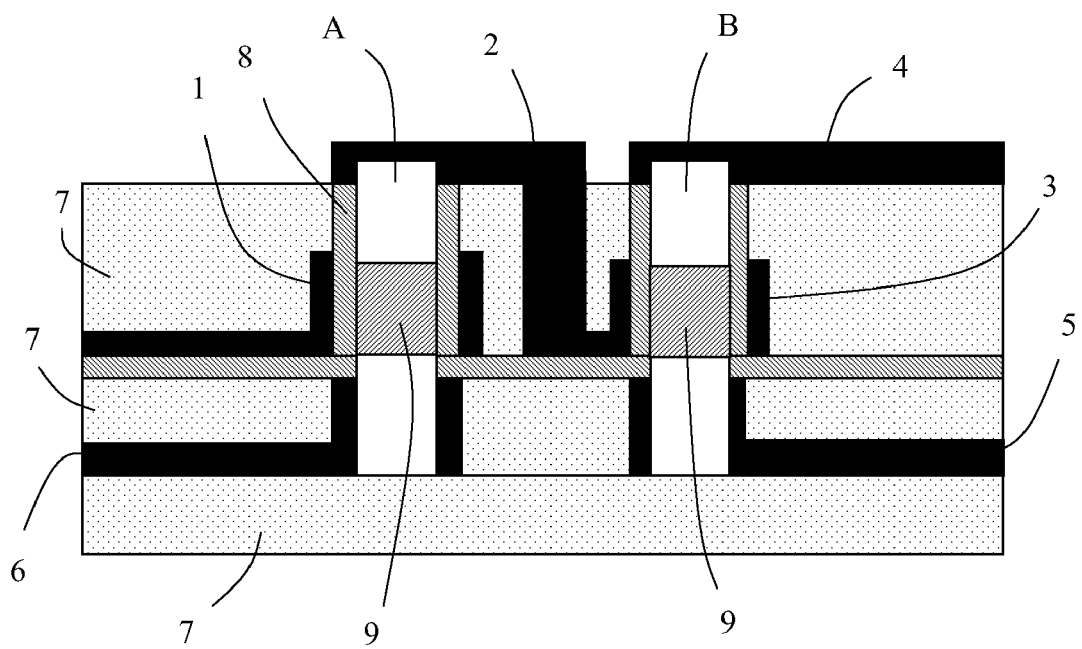
Figure 2B:
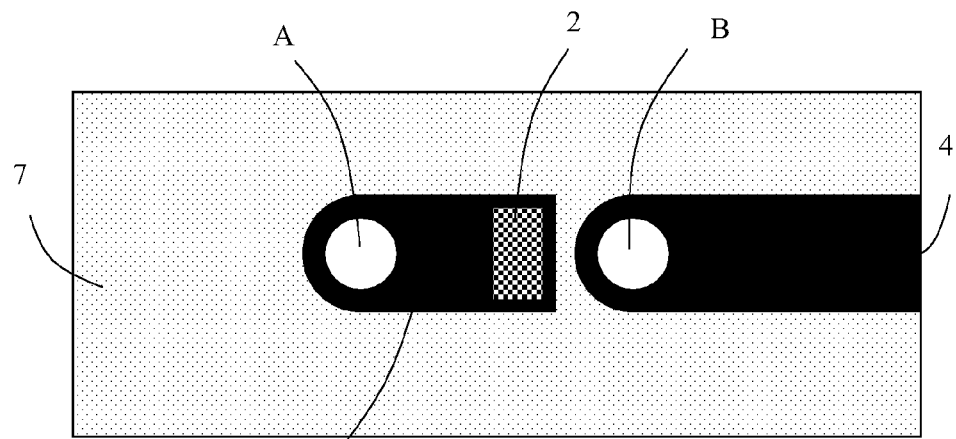
Figure 2C:
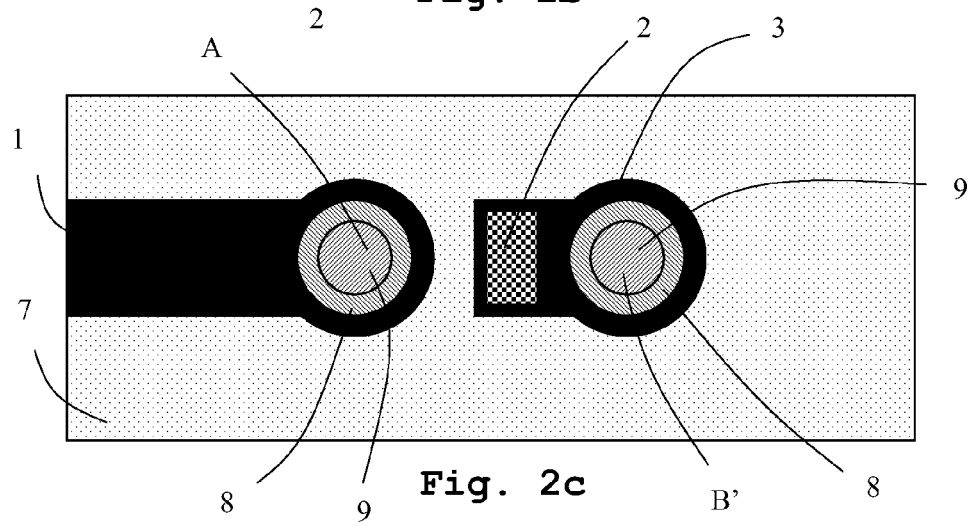
Figure 2D:
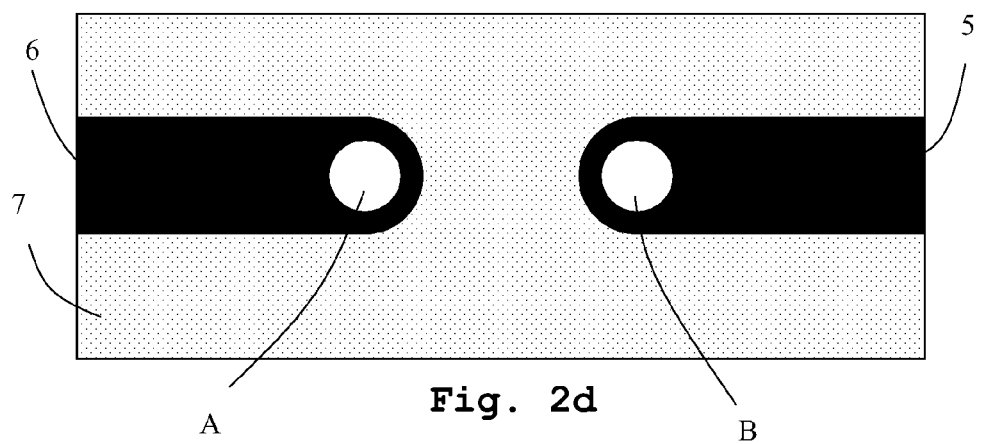

FIG. 2a schematically illustrates a charge storage device having a vertical design according to the present invention comprising a first and a second nanowire A, B. The nanowires A, B are at least along a portion of the length thereof enclosed by a dielectric layer 8. A first wrap gate 1 is arranged around a portion of the dielectric layer 8 of the first nanowire A and a second wrap gate is arranged around the dielectric layer 8 of the second nanowire B. A nanowire section 9 of each nanowire A, B is thereby surrounded by the wrap gate 1, 3. A charge storing terminal 2 connects one end of the first nanowire A with the second wrap gate 3. The second nanowire B is a read-out FET having a drain contact 4 connected to one end of the nanowire B and a source contact connected to the other end of the nanowire B. A bit line contact 6 is connected to the base of the first nanowire A. By way of example the source contact 5 and the bit line contact 6 are in a wrap-around configuration, however not limited to this. FIG. 2b illustrates a top view of a cross section of the charge storage device at the level where the charge storing terminal 2 is connected to said one end of the first nanowire A. The different parts of the charge storage device are preferably embedded in an insulator 7. FIG. 2c illustrates a top view of a cross section of the charge storage device at the level of the wrap gates 1, 3. The vertical portion of the charge storing terminal 2 is indicated in the figures. FIG. 2d illustrates a top view of a cross section of the charge storage device at the level of the bit line contact 6 and the source contact 5.

Figure 3:
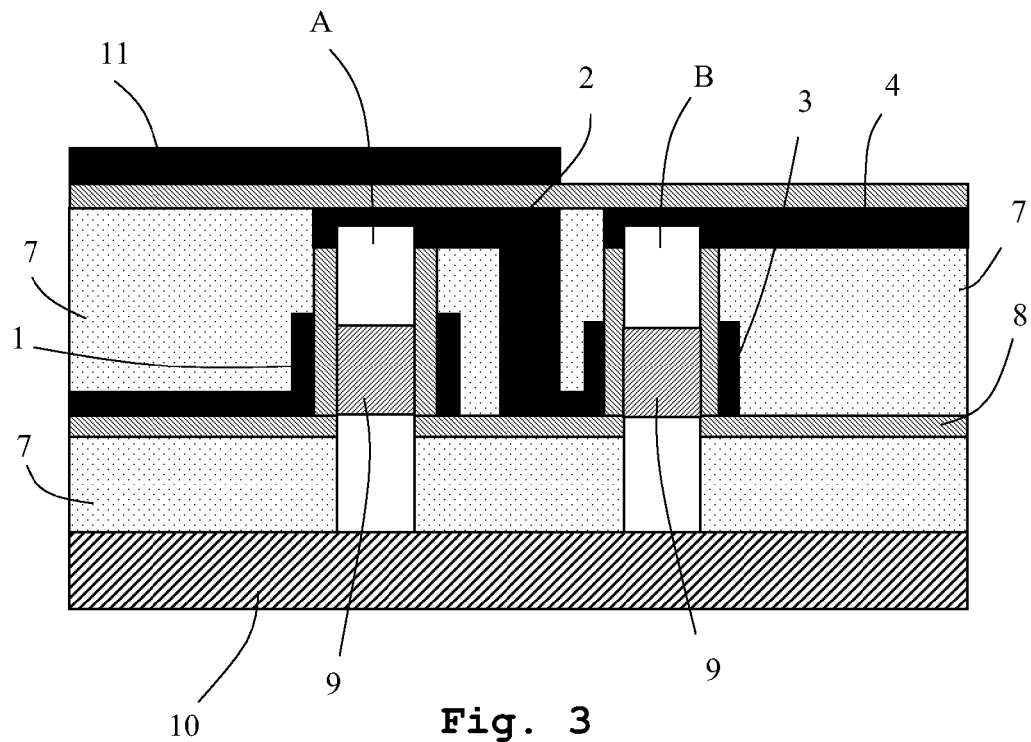

Referring to FIG. 3, in one embodiment of a charge storage device according to the present invention a common ground 10 can be connected to the bases of nanowires A and B, in which case charge can instead be transferred to charge storing terminal 2 by means of capacitive coupling. This can be achieved either by applying a voltage β to a counter electrode 11 positioned close to the charge storing terminal 2, or with a corresponding voltage applied to nanowire B. In the latter case nanowire B will also act as bit line to nanowire A.

When the charge storing terminal 2 has been charged, the resistance of nanowire A is increased by applying a voltage γ to wrap-gate 1. Thereafter the voltage β is removed, and charge on the charge storing terminal 2 is stored.

The memory read-out is done non-destructively. A memory node is connected to wrap-around gate 3 of nanowire B where the memory state can be determined. If the charge storing terminal 2 is charged, this will affect a current flowing in nanowire B, indicating that the memory cell is charged. The second nanowire can be described as a read-out field effect transistor, read-out FET, as mentioned above wherein the charge in the charge storing terminal (2) will affect the current flowing through the read-out FET, and a first current can be associated to a first memory state corresponding to a first charge and a second current can be associated to a second memory state corresponding to a second charge.

Erasing of the memory is done by applying a voltage α (or voltage close to this value) to wrap-around gate 1. Charge will then leave the charge storing terminal 2. Erasing can be enhanced by applying a voltage opposite to β (or voltage magnitude close to this value) to the base of nanowire A, i.e. the bit line contact 6, or to the counter electrode 11 capacitively coupled to the charge storing terminal 2.

Unwanted charge leakage from the memory is suppressed by effective electrostatic control from the wrap-around gate 1 surrounding nanowire A. This reduces the need for memory refresh, and thus gives lower power consumption. The leakage can be further suppressed by adding a designed heterostructure barrier in the nanowire section 9 of the first nanowire A surrounded by the first wrap-around gate 1. One or more materials can then be used in the nanowire in this nanowire section 9 to suppress leakage currents, but designed in such a way that the writing speed of the memory is optimized. This can be done by cresting the barrier, such that the effective barrier height decreases when nanowire A is biased with a voltage. The use of crested heterostructures, as described in literature to enhance performance, is especially suited to this invention as various heterostructures can be grown in nanowires, less limited by lattice mismatch. In a memory application this especially valuable as high enough bandgap offsets can be achieved to avoid charge leakage and create less volatile memories. The nanowire section 9 of the first nanowire 1 surrounded by the first wrap-around gate 1 can also be impurity doped, with opposite doping to the rest of the nanowire. In this case transport takes place when an inversion layer is formed in the region. One advantage with the charge storage device having a first wrap gate 1 controlling the current flow through the first nanowire A is that the design of the first nanowire A can be optimised with respect to desired properties. A heterostructure, such as the multiple tunnel barrier is optional. By way of example the first nanowire A can be a homogenous nanowire, which e.g. simplifies the fabrication thereof.

In one embodiment the second nanowire B is provided with a heterostructure including a barrier or an impurity doped region in a nanowire section 9 enclosed by the second wrap-gate 3, to optimize the characteristics of the transistor based on nanowire B with regards to the use of positive or negative charge in the memory.

Figure 4:
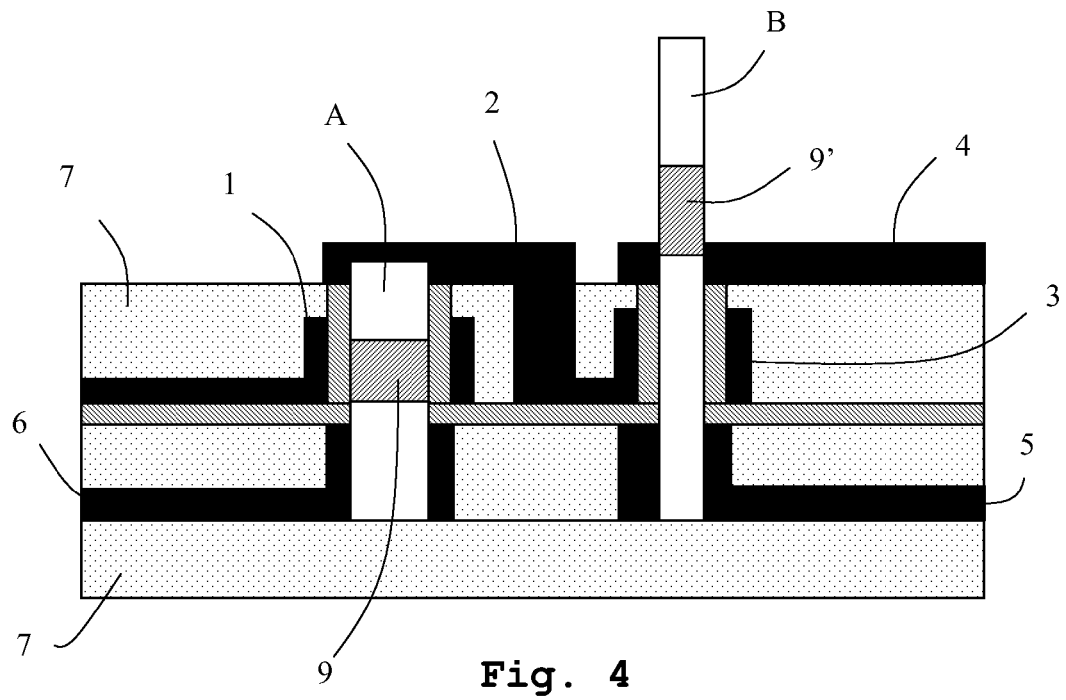

Referring to FIG. 4, when fabricating a device with an epitaxial altered (or by doping), heterostructure nanowire section 9 surrounded by the first wrap gate 1 it can be advantageous to fabricate the two nanowires A and B at the same time. It is then of importance that the epitaxially altered region in the read-out FET (the second nanowire B) is placed either in proximity of the second wrap gate 3, or outside the transistor. In order to facilitate such fabrication different nanowire diameters can be used so that the first nanowire A will grow shorter than the second nanowire B. A heterostructure in the second nanowire is then formed in a nanowire section 9 at a different lateral level than within the second wrap gate 3, e.g. on the opposite side of the drain contact 4. If the first nanowire A is grown shorter than the second nanowire B the processing is simplified if the first nanowire A is connected to the middle region of the second nanowire B in one lateral level.

In one embodiment of the present invention the nanowires A, B are of different diameter to align the charge storing terminal 2 and the wrap gate 3 to one lateral level while contacting the top of the first nanowire A and to the middle region of the second nanowire B In the above the charge storing device, suitable for being used as a memory, has been described as comprising only two nanowires. This represents the smallest functional unit of the present invention and the present invention is not limited thereto. A realistic implementation of a memory based on the invention will typically comprise a large plurality of the two nanowire charge storing device.

While the invention has been described in connection with what is presently considered to be the most practical and preferred embodiments, it is to be understood that the invention is not to be limited to the disclosed embodiments, on the contrary, is intended to cover various modifications and equivalent arrangements within the appended claims.

The invention claimed is:

1. A charge storage device suitable for memory applications, comprising nanowires as functional parts, wherein:
   a first nanowire with a first wrap gate arranged around a portion of its length, and a charge storing terminal connected to one end of the first nanowire;
   a second nanowire with a second wrap gate arranged around a portion of its length; and
   the charge storing terminal is connected to the second wrap gate;
   whereby a charge stored on the charge storing terminal can affect a current in the second nanowire, wherein at least the first nanowire comprises a heterostructure within a nanowire section of the first nanowire surrounded by the first wrap gate.

2. The charge storage device according to claim 1, further comprising a bit line contact connected to the opposite end of the first nanowire from the charge storing terminal, the bit line contact adapted to inject charge to the first nanowire which is transferred to the charge storing terminal if a resistance of the first nanowire is lowered by applying a pre-determined voltage to the first wrap gate.

3. The charge storage device according to claim 1, wherein the second nanowire is a read-out FET, and the charge in the charge storing terminal will affect the current flowing through the read-out FET, and a first current can be associated to a first memory state corresponding to a first charge and a second current can be associated to a second memory state corresponding to a second charge.

4. The charge storage device according claim 1, further comprising a counter electrode arranged adjacent to the charge storing terminal, the counter electrode adapted to capacitively transfer charge to the charge storing terminal.

5. The charge storage device according to claim 1, wherein the second nanowire is arranged to via the second wrap gate transfer charge to the charge storing terminal.

6. The charge storage device according to claim 1, wherein the heterostructure is a crested heterostructure.

7. The charge storage device according to claim 1, wherein the first and second nanowires are vertically upstanding from a substrate and epitaxially grown from the substrate.

8. The charge storage device according to claim 1, wherein the first nanowire is shorter than the second nanowire.

9. The charge storage device according to claim 1, wherein the charge storing terminal is aligned to one lateral level with the second wrap gate.

10. A charge storage device suitable for memory applications, comprising nanowires as functional parts, wherein:
    a first nanowire with a first wrap gate arranged around a portion of its length, and a charge storing terminal connected to one end of the first nanowire;
    a second nanowire with a second wrap gate arranged around a portion of its length; and
    the charge storing terminal is connected to the second wrap gate;
    wherein the first and second nanowires are vertically upstanding from a substrate and epitaxially grown from the substrate.

11. A charge storage device suitable for memory applications, comprising nanowires as functional parts, wherein:
    a first nanowire with a first wrap gate arranged around a portion of its length, and a charge storing terminal connected to one end of the first nanowire;
    a second nanowire with a second wrap gate arranged around a portion of its length; and
    the charge storing terminal is connected to the second wrap gate;
    wherein the first nanowire is shorter than the second nanowire.

12. The charge storage device according to claim 11, wherein the charge storing terminal is aligned to one lateral level with the second wrap gate.

13. The charge storage device according to claim 12, wherein the first and second nanowire are of different diameter.

* * * * *